(12) United States Patent
Baiko et al.

(10) Patent No.: US 6,845,007 B1
(45) Date of Patent: Jan. 18, 2005

(54) PROTECTIVE SHEATH FOR PERIPHERAL CARDS USED IN DIGITAL DEVICES

(75) Inventors: Terry Baiko, San Jose, CA (US); Bill Hanson, Mountain View, CA (US); Len Turnbow, San Jose, CA (US)

(73) Assignee: palmOne, Inc., Santa Clara, CA (US)

( * ) Notice: Subject to any disclaimer, the term of this patent is extended or adjusted under 35 U.S.C. 154(b) by 51 days.

(21) Appl. No.: 10/081,354

(22) Filed: Feb. 21, 2002

(51) Int. Cl.$^7$ .................................................. G06F 1/16
(52) U.S. Cl. ............................. *lp*;1*p*361/686; 361/683
(58) Field of Search ................................ 361/683–684, 361/686

(56) References Cited

U.S. PATENT DOCUMENTS

| | | | | |
|---|---|---|---|---|
| 6,126,595 A | * | 10/2000 | Amano et al. | 600/300 |
| 6,224,254 B1 | * | 5/2001 | Hayek et al. | 368/281 |
| 6,532,152 B1 | * | 3/2003 | White et al. | 361/692 |

OTHER PUBLICATIONS

Hanson et al. (US 2003/0071791 A1), "Accessory Module for Handheld Devices", Apr. 17, 2003.*
Ito (US 2003/0186570 A1), "Electronic Apparatus having a Plurality of Connectors for Card Like Devices", Oct. 2, 2003.*
Cheng (US 2003/0148664 A1), "Connection Port Structure of CF Card", Aug. 7, 2003.*

* cited by examiner

*Primary Examiner*—Yean-Hsi Chang
(74) *Attorney, Agent, or Firm*—Wagner, Murabito & Hao LLP

(57) ABSTRACT

A device for protecting peripheral component cards used in portable computers. The user may use a protective sheath over the extended portion of a peripheral card (e.g., Secure digital cards, Secure digital I/O, camera card or the like) which protrude out of the protective casing of a portable computer to protect the peripheral components from accidental damages. The protective sheath is designed to act as a cushion and to absorb forces applied to the peripheral card in case of an accidental drop or when coming into a contact with an external object. The user may carry a plurality of protective sheath, which are adopted to fit a plurality of peripheral component cards.

26 Claims, 11 Drawing Sheets

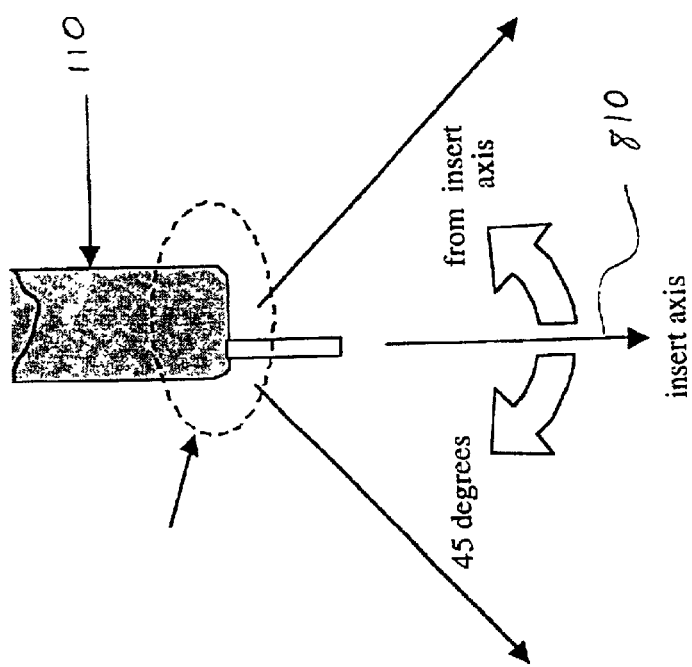

PROTECTIVE SHEATH FOR PERIPHERAL CARDS USED IN DIGITAL DEVICES

BACKGROUND OF THE INVENTION

1. Field of the Invention

The present invention relates to the field of computer systems and data communication. More specifically embodiments of the present invention relate to protecting peripheral components attached to portable computers.

2. Related Art

The demand for the use of computers has steadily grown over the period of the past several decades. The ever-increasing demand in use of the computers and widespread reliance of individuals as well as business entities on computers along with the reduction in the size of the components led to the innovation of portable computer systems. Shortly after the introduction of the portable computers to the marketplace, the users of these devices demanded flexibility in their use and portability. Consumers seeking mobility of their portable computers require smaller size devices.

The popularity of portable computers caused favorable changes in manufacturing forecasts and manufacturing plans to satisfy the market demands. However, along with such an increase in popularity came the consumer demand for new features, features commensurate with the nature and method of use of portable devices. Furthermore, the advent of Internet and the ever-increasing reliance on electronic mail presented added requirements to the existing one; Internet connectivity and e-mail capability.

To respond to the market demands, once again manufacturers had to incorporate the customer requirements into the design of their new products and to make improvements in the existing capabilities. An improved portable computer, responding to the consumer requirements, can connect to a modem, enabling it to have electronic mail (e-mail) capabilities. Another recent development in portable computer technology is capability to browse Web pages located on the Internet and synchronize, e.g., HotSync, with another device or with a compatible personal computer. Moreover, an advanced portable computer can have Internet capabilities to communicate over a wireless interface (e.g. radio interface).

Furthermore, owners of portable computers capable of wireless connectivity, Internet accessibility, and e-mail capability, demanded a portable computer with a larger memory. The ever increasing market acceptance and extensive use of portable computers with large memory increased customer expectation to the point that an owner of a portable computer demanded not only to have a portable computer with a large memory, but also a portable computer capable of receiving different peripheral components. Conventional peripheral components or smart media cards in use ranges from an extended memory card, a card containing a dictionary, or different games. Prior Art FIG. 1A depicts smart card 101 inserted in a slot in portable computer 110. Side 102 of smart card 101 is substantially flush with side 103 of portable computer 110 where the slot is located.

The users of portable computers, nowadays, who wishes to establish wireless communication can purchase a peripheral component with radio frequency capability or Base Band type-II external cards and upgrade his/her host device to achieve, for example, Bluetooth capability. In other instances, a user may wish to equip his/her device with a peripheral component containing a large technical dictionary, a card containing maps of different cities, or the likes.

Nowadays, it is not unusual to see an owner of a portable computer with a folder containing a number of peripheral cards, which can easily be used in a portable computer. Innumerable peripheral cards supporting different functions are available in the market place. An owner of a portable computer may own several different peripheral cards, supporting different functions, and the owner of the device may swap peripheral card as deemed appropriate.

A modern portable computer, generally, has a receptacle or a "slot" designed to receive different peripheral components. A user of a portable computer can easily insert a peripheral card into the slot in the portable computer and access the information stored in the peripheral component. However, the peripheral cards generally vary in size, and in some instances (e.g., Secure digital I/O, camera cards, etc . . . ) these peripheral cards are longer than the depth of slot provided to receive the peripheral cards. For example a Bluetooth card must extend outside the slot due to the inherent function of the card, requiring an embedded antenna to be exposed as a transceiver of radio signals.

Traditional portable computers provide a slot on a portable computer, which can be used, for receiving peripheral cards and hence augmenting a variety of non-standard functions to a portable computer. However, a device with capability of receiving peripheral component cards (e.g., external memory cards, Bluetooth, camera cards, technical dictionary, and the like) needs to have the peripheral card to communicate with a resident memory as quickly as possible. The standard serial bus and USB are not capable of a quick download or up-load.

Secure digital (SD) communication standard, available in the market, provides a response to the above mentioned shortcomings. A secure digital device (e.g., SDIO) can carry many different peripheral components containing external memory, games, databases, etc. The secure digital cards can be inserted into the slots provided on a portable computer to receive peripheral components as depicted in Prior Art FIG. 1B. Prior Art FIG. 1B depicts portable computer 110 with SD card 120 electrically coupled to portable computer 110. It is appreciated that SD communication standard requires SD connector 130 to provide communication between portable computer 110 and SD card 120. A user of a portable computer can easily port data from one device to another device by swapping the cards or expand the portable computer's memory very conveniently. Prior Art FIG. 1C is a depiction of a SD card 120 inserted in portable computer 110 where the insertion slot is located on top.

SUMMARY OF THE INVENTION

An embodiment of the present invention enables a user to use different length peripheral cards, which may extend beyond the protective frame of the portable computer, without danger of accidental damage. In one embodiment of the present invention a protective sheath encloses the extended portion of the peripheral card while the protective sheath is tightly attached to the portable computer. In another embodiment, the secure digital input/output (SDIO) card is inserted into a slot provided in the protective sheath and the slot in the portable computer while the protective sheath and portable computer are loosely attached together. In another yet embodiment of the present invention, the protective sheath is an elastomeric material that can transfer substantial portion of the impact energy, in case of a fall, around the peripheral card and to the body of the portable computer.

Another embodiment of the present invention limits travel of peripheral card in the insert direction to less than 1 mm while the fit between the protective sheath and the SDIO card is tight enough to prevent the protective sheath from falling off under gravity, but loose enough to allow easy installation and removal. Another embodiment of the present invention provides the protective sheath to absorb a force resulting from a fall of the portable computer from a height of approximately 36". Yet in another embodiment, the present invention protects the peripheral cards from an impact resulting from a drop of the portable computer onto a concrete on any impact vector within a 90 degree (+/−45 degrees from axis) cone centered on the insertion axis. In yet another embodiment of the present invention, the protective sheath can be used when the slot receiving the peripheral cards is located along any side of the portable computer. This invention provides for a protective sheath to conform to the geometry of the specific peripheral card at the insertion site.

A device for protecting a peripheral card used in a portable computer. The user may use a sheath over the extended portion of a secure digital input/output (SDIO) card which protrude beyond the protective casing of a portable computer. The protective sheath is designed to act as a cushion and to absorb forces applied to the peripheral card in case of a fall or if the protruded is caught by external material. The user may carry a plurality of adjustable protective sheaths to fit a plurality of P.C. card used in portable computers.

BRIEF DESCRIPTION OF THE DRAWINGS

FIG. 8 illustrates the protective range provided by a protective sheath in accordance with one embodiment of the present invention.

DETAILED DESCRIPTION OF THE INVENTION

Reference will now be made in detail to the preferred embodiments of the present invention, a protective sheath for peripheral cards used in digital devices, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Exemplary Palmtop Computer System Platform

The present invention is compatible with any electronic device having a wireless or other communication mechanism and organized records of information, such as a cell phone, a digital watch or a pager. One of the common types of electronic systems, which can be used in accordance with one embodiment of the present invention, is referred to as a personal digital assistant, or commonly called a PDA. The PDA is a pocket sized electronic organizer with the capability to store telephone numbers, addresses, daily appointment, and software that keeps track of business or personal data such as expenses, etc. Furthermore, the PDA also has the ability to connect to a personal computer, enabling the two devices to exchange updated information that is synchronizing the information between the two devices. Additionally, the PDA can also be connected to a modem, enabling it to have electronic mail (e-mail) capabilities over the Internet along with other Internet capabilities. Moreover, an advanced PDA can have Internet capabilities over a wireless communication interface (e.g., radio interface).

Figure 2:
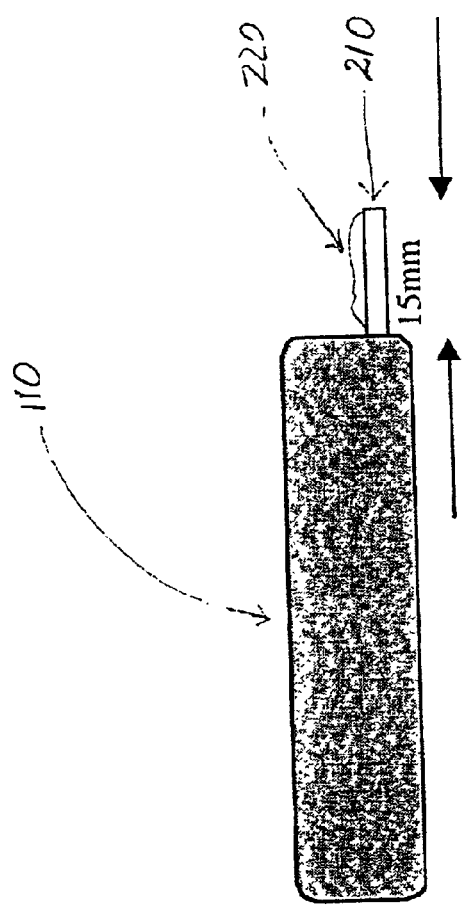
FIG. 2 illustrates an SDIO card inserted into a portable computer with a portion of the card protruding outside the receiving slot in accordance with one embodiment of the present invention.

FIG. 2 is an exemplary illustration of SDIO card 210 inserted into a slot provided on portable computer 110. Portion 220 of SDIO 210 protrudes from portable computer 110 and extends out of the slot provided in portable computer 110. Extended portion 220 of secure device card (SDIO) 210 is extended out to perform a certain independent function. For example, SDIO 210 complying with Bluetooth standard may have an imbedded antenna in protruded portion 220 of SDIO card 210. Extended portion 220 outside portable computer 110 may enhance data transmission to and from portable computer 110. In another example, secure digital card 210 may be a camera card. In the case where secure digital card 210 is a camera card, the extended portion may include a lens and the protrusion in necessary for the lens to be exposed and able to observe the intended objects.

Figure 3A:
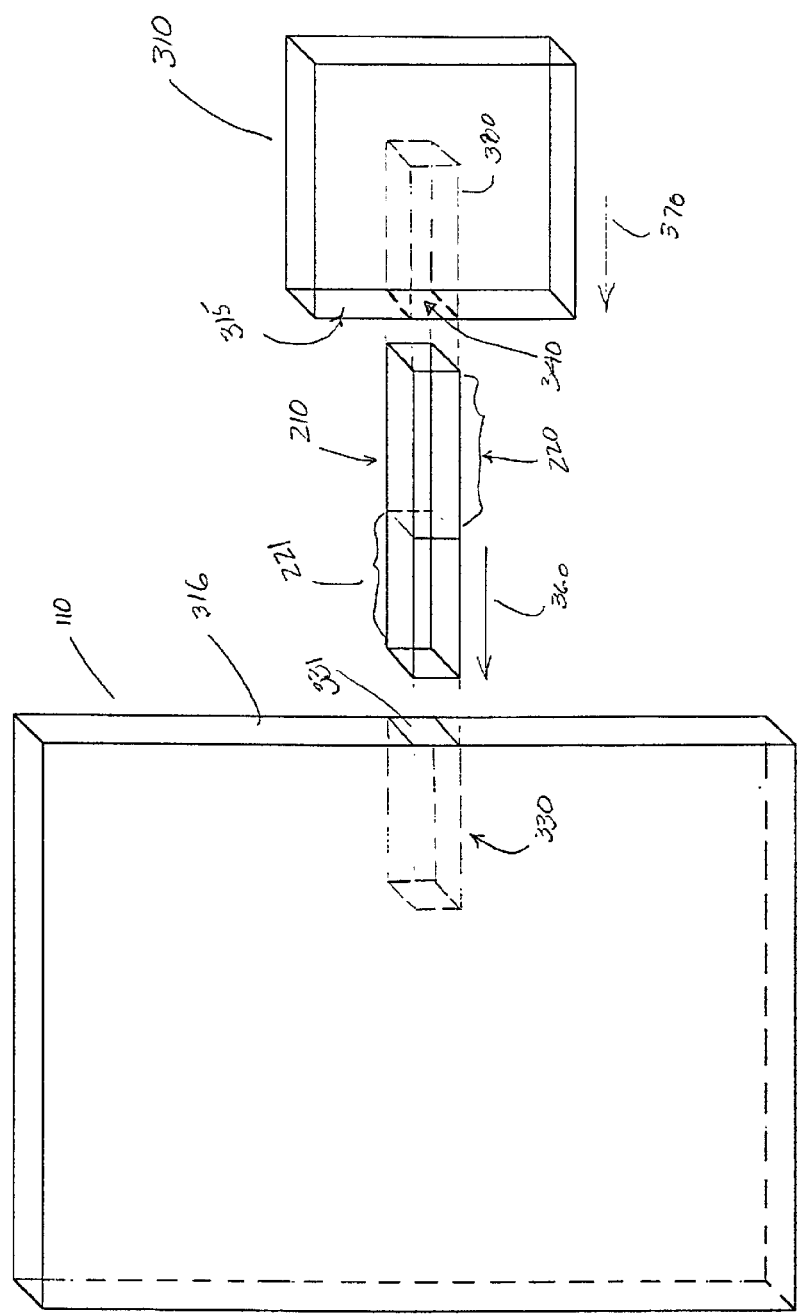
FIG. 3A illustrates an SDIO card in position to be inserted into a protective sheath and a portable computer in accordance with one embodiment of the present invention.

FIG. 3A depicts an embodiment of the present invention. SDIO card 210 is in position to be inserted into portable computer 110 in direction 360. A user may push SDIO 210 into slot 330 in direction 360. SDIO 210 does not entirely fit inside slot 330 and portion 220 will extend out and remains exposed. Portion 221 of SDIO 210 will fit inside slot 330 and will be protected against any accidental damages. Protective sheath 310 has a rectangular slot 380 with opening 340 and dimensions substantially the same as the cross sectional dimensions of SDIO 210.

An embodiment of the present invention enables a user to protect exposed portion 220 of SDIO 210 from accidental damage. FIG. 3A illustrates that a user may push protective sheath 310 in direction 370 to receive portion 220 of SDIO 210 inside protective sheath 310 enfolding exposed portion 220 inside rectangular slot 380. Once portion 220 is enfolded by protective sheath 310, protective sheath 310 prevents damage to peripheral component 210 resulting from accidental drops from, for example, a height of 36 inches.

In another embodiment of the present invention, rectangular slot 380 may extend from a first side of protective sheath to a second side of protective sheath 310 to form a through hole along an axis of protective sheath 310. SDIO card 210 can be inserted into the hole in protective sheath 310 from side 1 or side 2. According to this embodiment of the present invention, portion 220 of SDIO 210 will remain inside protective sheath 310 and portion 221 will protrude out of protective sheath and may be inserted into slot 330 through opening 331 to couple with portable computer 110. According to this embodiment, protective sheath 310 prevents damages to peripheral component 210 resulting from accidental drops from a height of 38 inches.

Figure 3B:
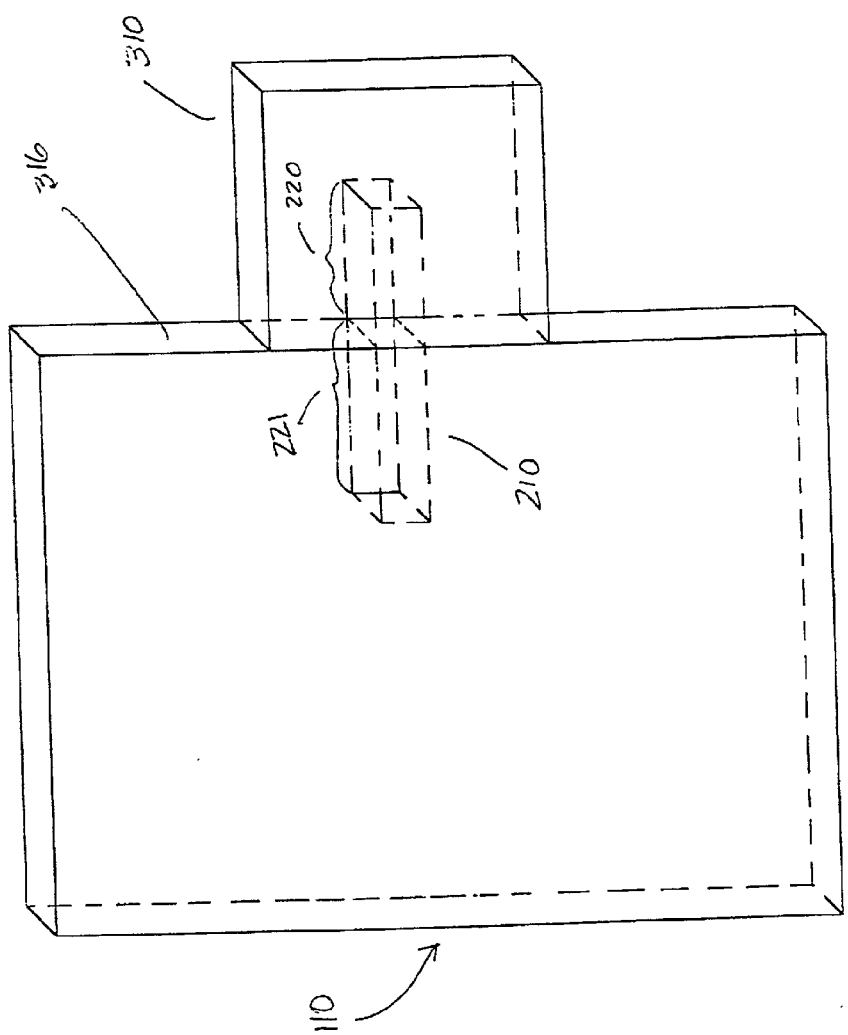
FIG. 3B illustrates an SDIO card inserted into a protective sheath and inserted into a portable computer in accordance with one embodiment of the present invention.

FIG. 3B is an exemplary depiction of the present invention. Upon the insertion of portion 221 of SDIO 210 inside slot 330 and the insertion of portion 220 of SDIO 210 inside protective sheath 310, side 315 of protective sheath 310 of FIG. 3A comes into a contact with side 316 of portable computer 110. The contact of protective sheath 310 and portable computer 110, with SDIO card 210 inserted inside protective sheath 310 and portable computer 110 as explained, protects SDIO card 210 during a 36 inch accidental drop onto a concrete floor from any impact vector, for example, within a 90 degree (+/−45 degrees from axis) cone centered on the insertion axis as depicted in FIG. 8.

Figure 1A:
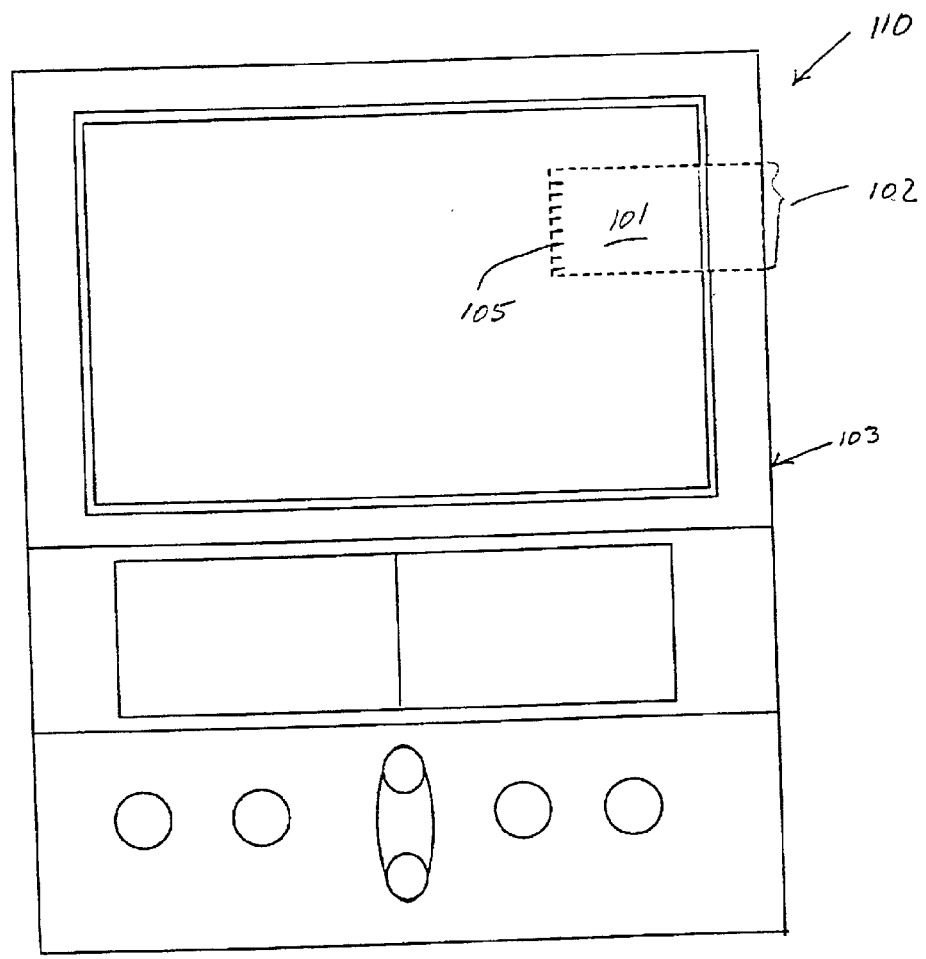
FIG. 1A (Prior Art) depicts a typical portable computer with smart media card.
Figure 1B:
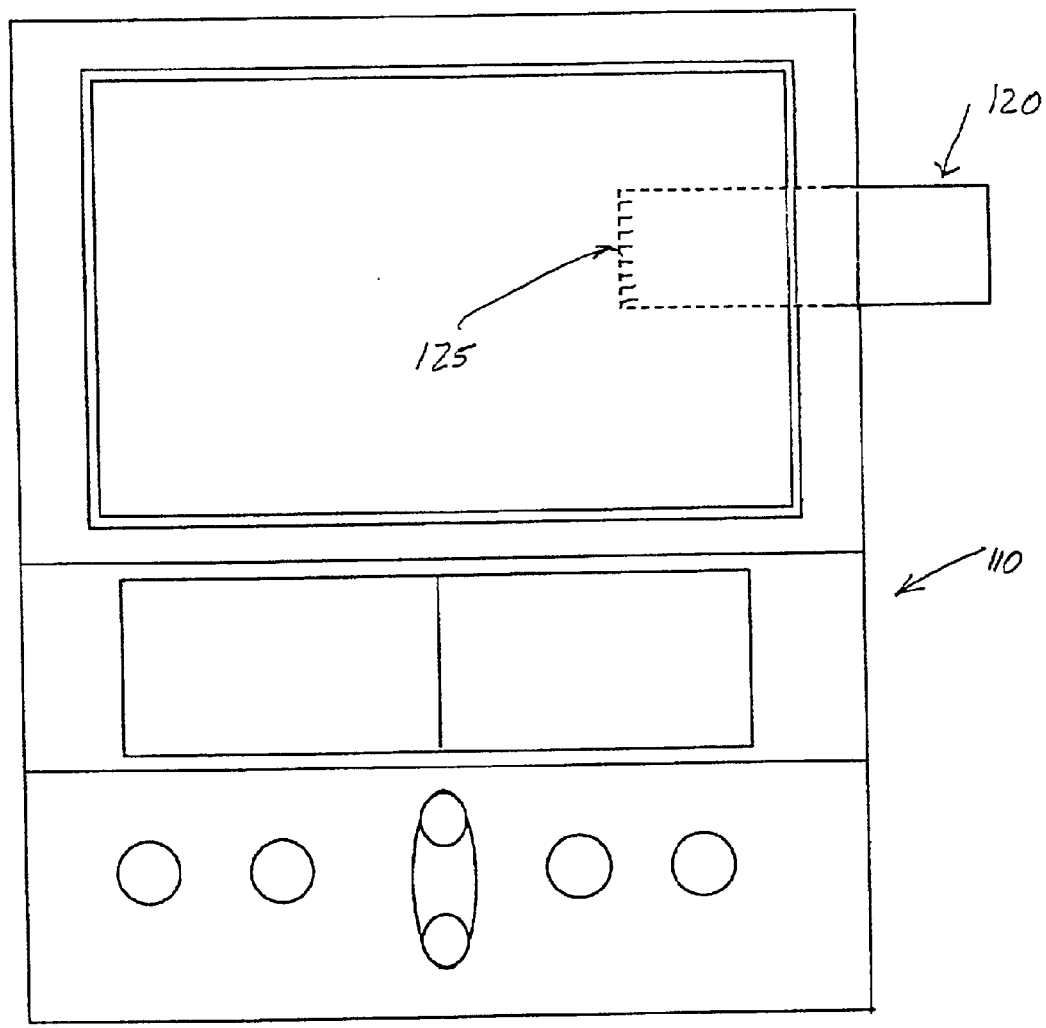
FIG. 1B (Prior Art) depicts a typical portable computer receiving SDIO from one side.
Figure 1C:
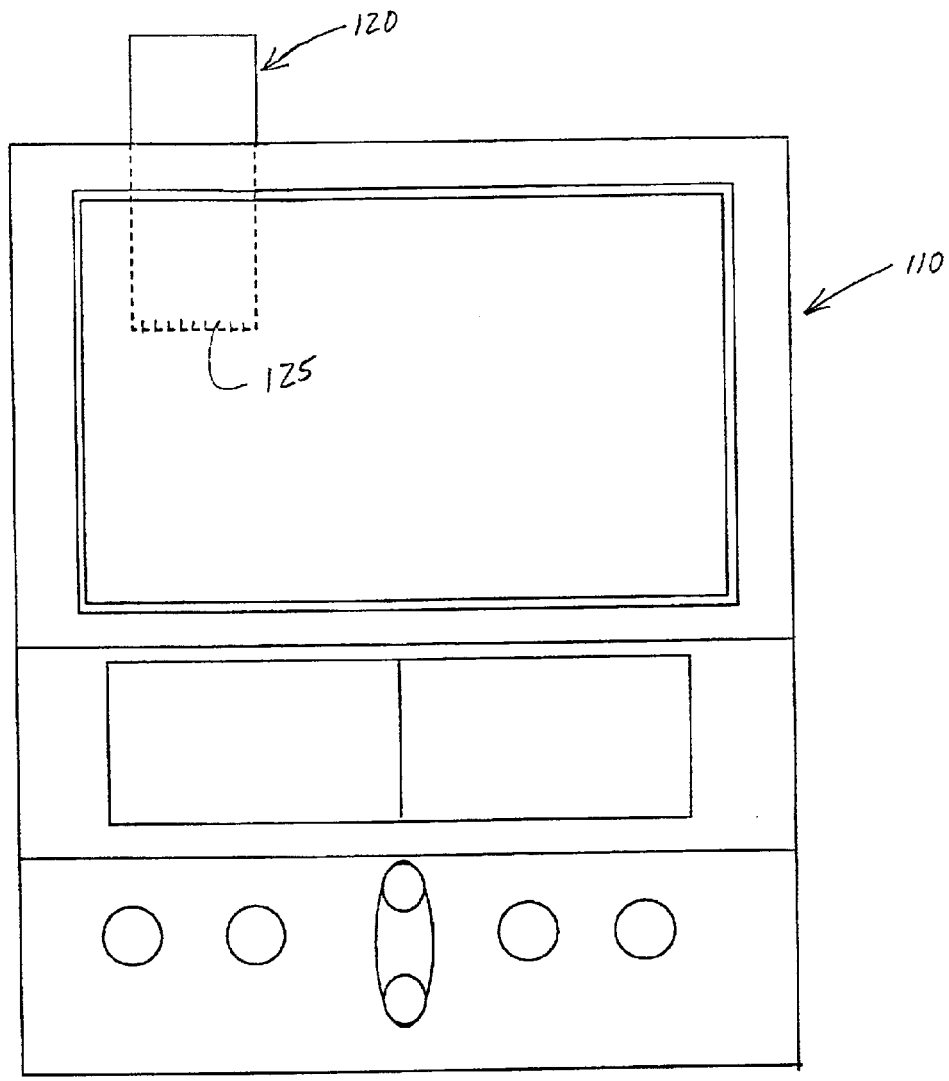
FIG. 1C (Prior Art) depicts a typical portable computer receiving SDIO from topside.

Another embodiment of the present invention, depicted by exemplary FIG. 3A, provides protection of SD connectors 125 of Prior Art FIG. 1B from accidental damage.

Figure 4:
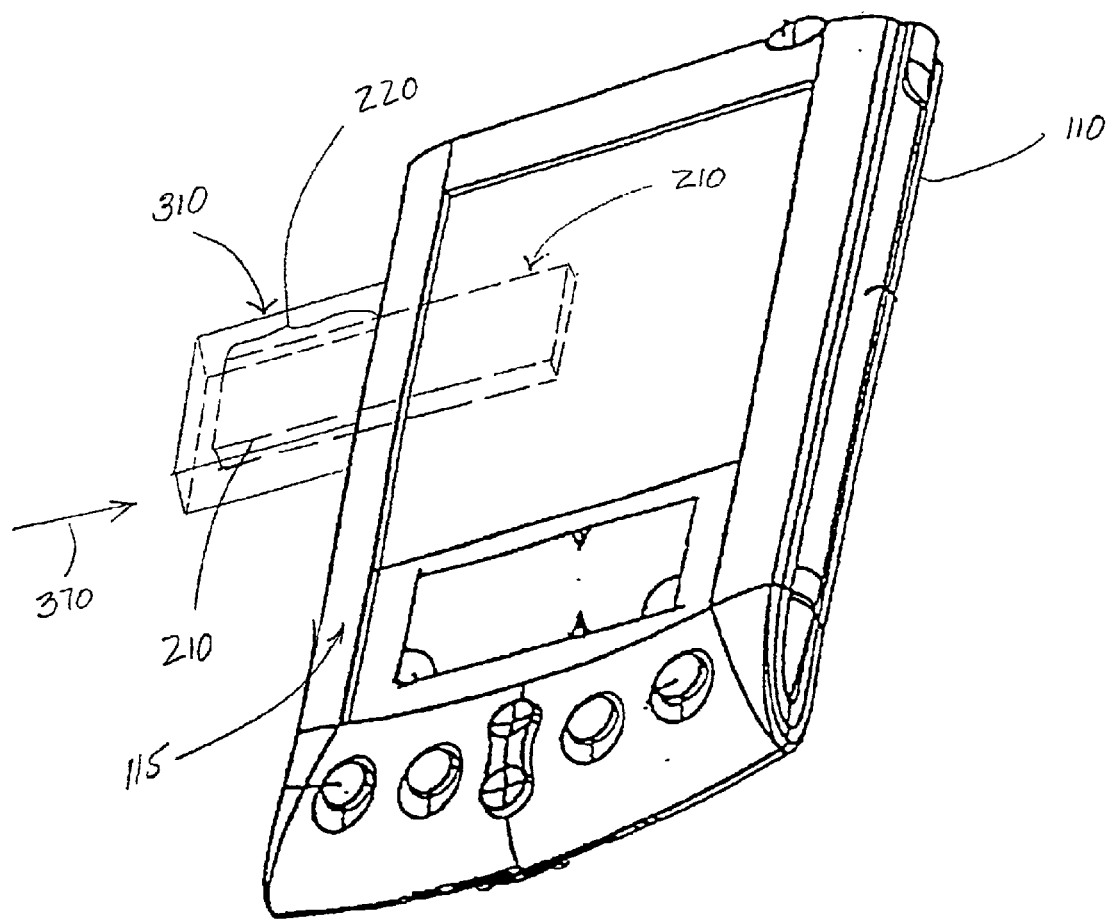
FIG. 4 illustrates an SDIO card inserted into a slot located on the left side of a portable computer and protected by the protective sheath in accordance with one embodiment of the present invention.

FIG. 4 is an exemplary illustration of an embodiment of the present invention where SDIO card 210 is inserted into a slot located on the left side of portable computer 110. Portion 220 of FIG. 2 extends out of portable computer 110 and is subject to accidental damages. Protective sheath 310 is used to protect exposed portion 220. A user aligns rectangular slot 340 of protective sheath 310 with extended portion 220 and pushes protective sheath 310 in direction 370 until side 315 of FIG. 3A contacts side 316 of portable computer 110.

Figure 5:
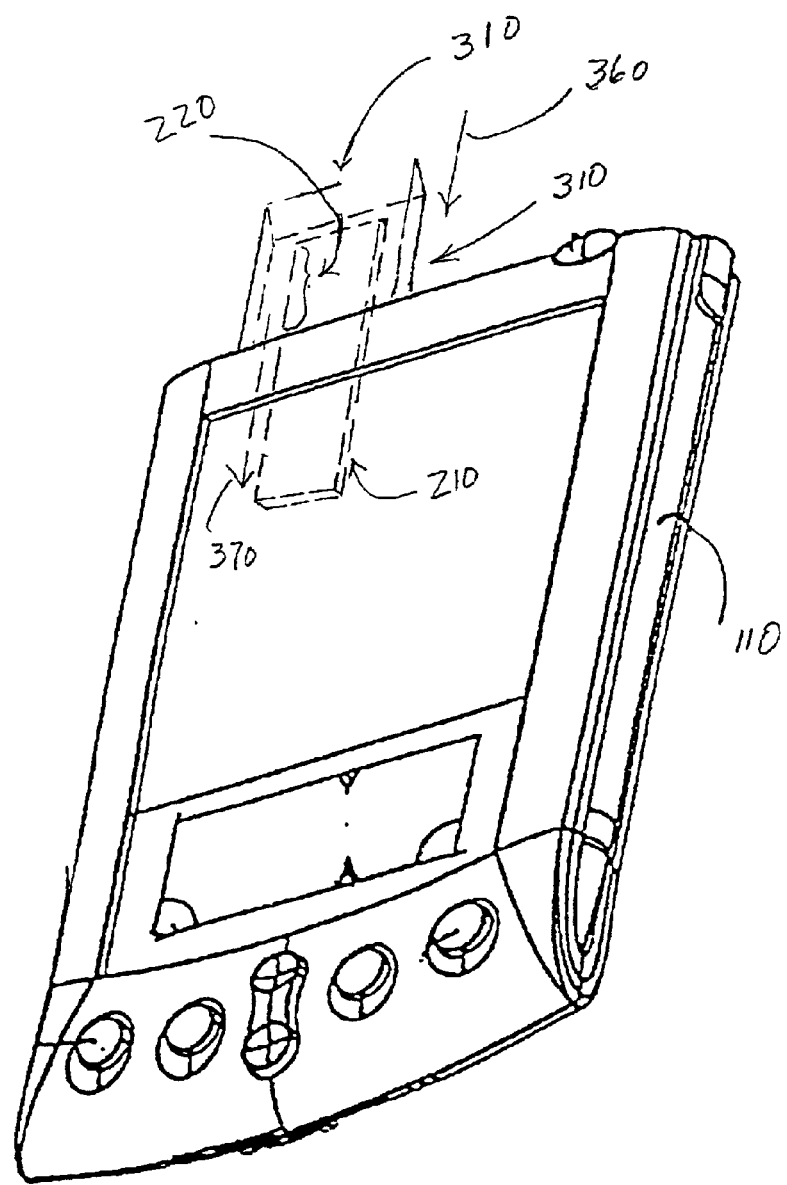
FIG. 5 illustrates a protective sheath placed on the exposed part of an SDIO card inserted into a slot on the top of the portable computer in accordance with one embodiment of the present invention.

FIG. 5 illustrates another embodiment of the present invention where protective sheath 310 receives the exposed portion 220 of SDIO 210 of FIG. 2. SDIO 210 is inserted into a slot on the topside of portable computer 110. Portion 220 of SDIO 210 of FIG. 2 remains exposed. Protective sheath 310 has a slot (not shown) with dimension substantially the same as SDIO 210's cross sectional dimension. A user may insert SDIO 210 inside the slot (not shown) of portable computer 110 and then align protective sheath 350 with SDIO 210 such that protective sheath 350 receives exposed portion 220 of SDIO 210 and covers the exposed portion in all directions. Protective sheath is pushed in direction 360 to mate with portable computer 110.

In another embodiment of the present invention, a user may insert portion 220 of SDIO card 210 inside a slot in portable computer 110, designed to receive SDIO cards, located on the topside of portable computer 110. The user then places protruded portion 220 along a slot in protective sheath 310 and pushes protective sheath 310 in direction 360 until protective sheath 310 comes into contact with portable computer 110.

Figure 6:
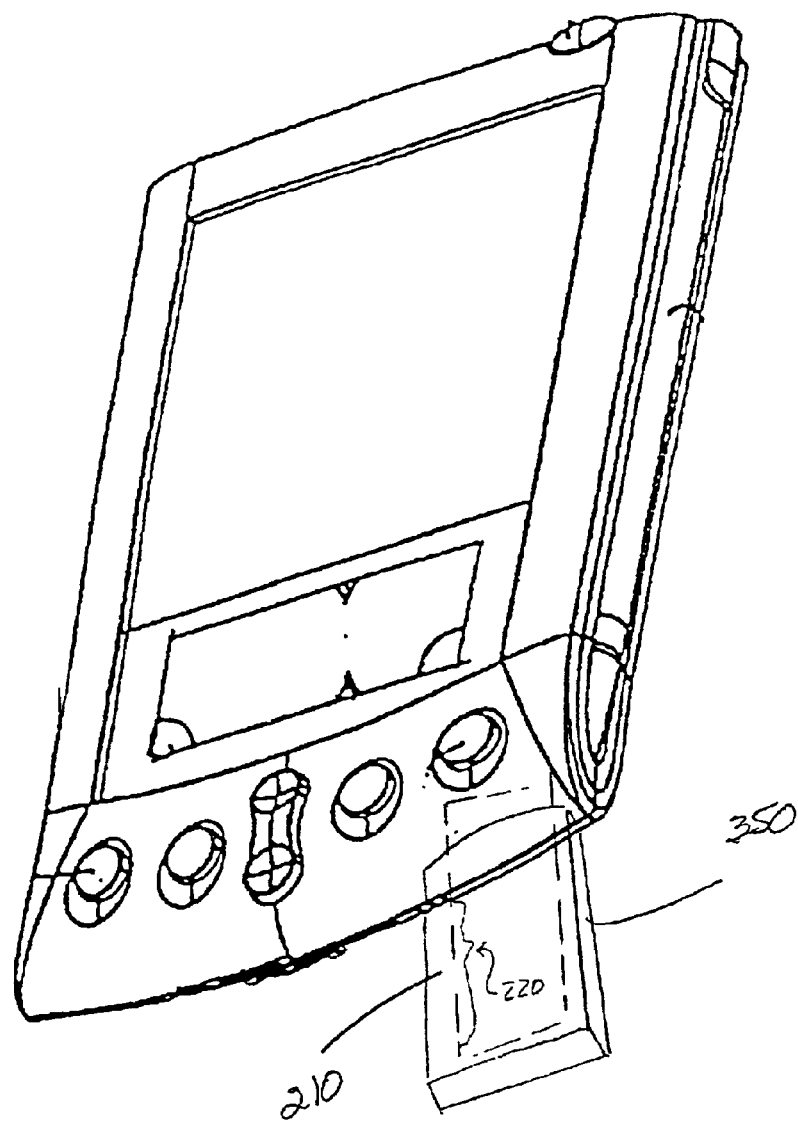
FIG. 6 illustrates a protective sheath placed on the exposed part of an SDIO card inserted into a slot on the bottom of the portable computer in accordance with one embodiment of the present invention.

FIG. 6 illustrates and embodiment of the present invention, where SDIO 210 is inserted into a slot on bottom side of portable computer 110. Portion 220 of SDIO 210 of FIG. 2 remains exposed. Protective sheath 350 has a slot (not shown) with dimension substantially the same as SDIO 210's cross sectional dimension. A user may insert protruded portion 220 of SDIO 210 inside the slot (not shown) of portable computer 110. Protective sheath enfolding protruded portion 220 and contacting portable computer 110 prevents accidental damage to SDIO resulting from an accidental drop from a distance of 36 inches.

Figure 7A:
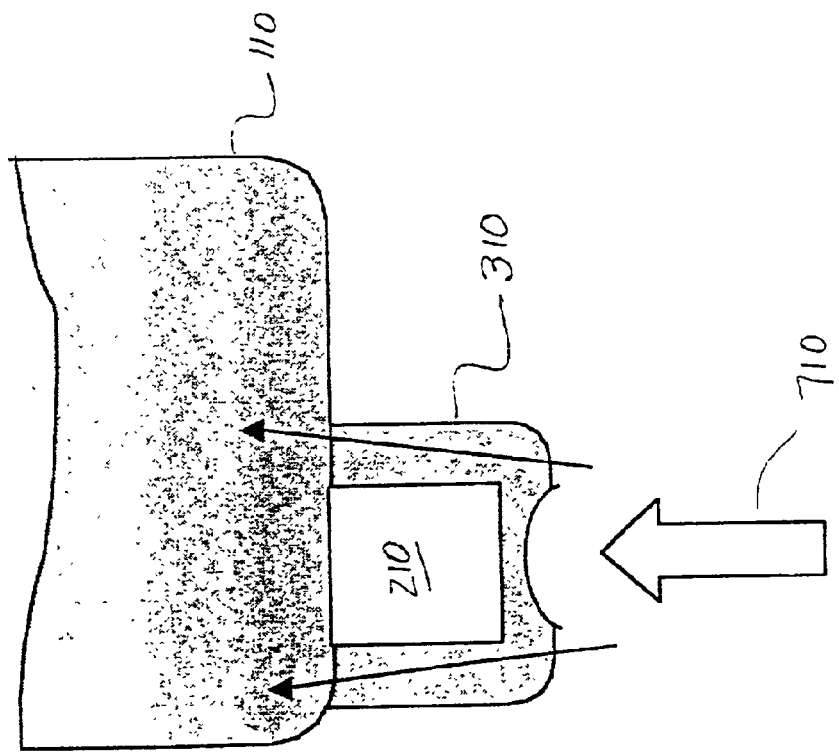
FIG. 7A shows a down view of a protective sheath in accordance with one embodiment of the present invention.

FIG. 7A is another embodiment of the present invention illustrating loss prevention when a typical SDIO 210 is being ejected from portable computer 110. According to this embodiment, protective sheath 310 limits ejection of SDIO 210 to 1-mm when a user attempts to remove SDIO 210. The fit between protective sheath 310 and SDIO card 210 is tight enough to prevent protective sheath 310 from falling off under gravity when being ejected, but loose enough for easy installation and removal. A user presses on protective sheath 310 in direction 710 and releases the pressure. Protective sheath 310 prevents travel of SDIO 210 to maximum of 1 mm, thus preventing SDIO from flying off and falling due to gravity force.

Figure 7B:
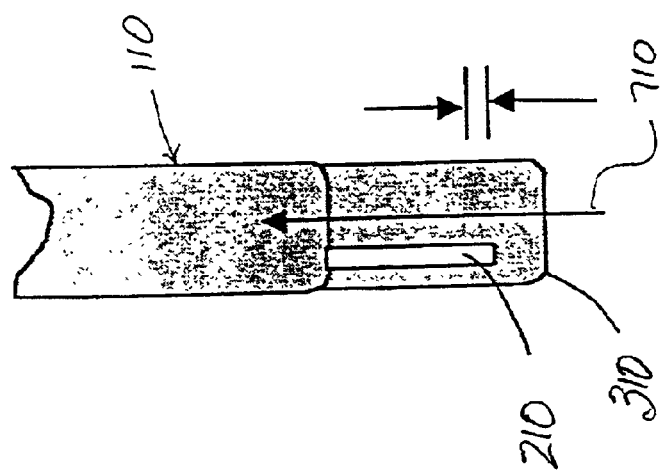
FIG. 7B shows a side view of a protective sheath in accordance with one embodiment of the present invention.

FIG. 7B illustrates direction of application of force, direction 710, and maximum displacement of SDIO when pressure is released.

FIG. 8 depicts another embodiment of the present invention, where protective sheath prevents damage to SDIO 210 when portable computer is accidentally dropped from a height of 36 inches onto a hard floor. FIG. 8 illustrates protection on SDIO and SD connectors during an accidental fall on a concrete on any impact vector within a 90 degree (+/−45 degree from axis 810) cone centered on the insertion axis 810.

In summary the present invention provides a device that protects an SD connector and an SDIO card. An embodiment of the present invention ensures protection of SDIO against accidental falls. Furthermore, this invention protects a user's SDIO cards from accidental damage while in a crowded surroundings (e.g. on a crowded bus, school hallways, etc) from accidental contact with external objects.

The foregoing description of the embodiments of the present invention has been presented for purpose of illustration and description. They are not intended to be exhaustive or to limit the invention to the precise form disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An impact protection device having a first interface configured to conform to a surface of a digital wrist watch portable computer device and a second interface configured to receive a peripheral component, the impact protection device comprised of an impact absorbing material to protect the peripheral component from damage when the peripheral component is coupled to the portable computer device, wherein the peripheral component is a secure digital input/output (SDIO) card and the second interface is configured to receive the SDIO card when the SDIO card is inserted into the portable computer.

2. An impact protection device of claim 1 where the portable computer has a slot for receiving the peripheral component card.

3. An impact protection device of claim 1 where the peripheral component protrudes outside a slot of the portable computer device for receiving the peripheral component.

4. An impact protection device of claim 1 where the portable computer has a front side where a display screen is located, a back side opposite the front side, a right side, a left side, a top side and a bottom side and wherein a slot for receiving the peripheral component is on the top side of the portable computer.

5. An impact protection device of claim 4 where the slot for receiving the peripheral component is on the right side of the portable computer.

6. An impact protection device of claim 4 where the slot for receiving the peripheral component is on the left side of the portable computer.

7. An impact protection device of claim 4 where the slot for receiving the peripheral component is on the bottom side of the portable computer.

8. An impact protection device of claim 4 wherein the protective device protects the protruding portion of the peripheral card when the peripheral card is inserted into the portable computer.

9. An impact protection device of claim 1 wherein the impact protection device comprises an elastic material.

10. An impact protection device of claim 1 wherein the impact protection device comprises a material allowing transfer of energy through the material.

11. An impact protection device of claim 1 where the portable computer comprises a cellular telephone.

12. An impact protection device of claim 1 where the portable computer comprises a personal digital assistant (PDA).

13. An impact protection device having a first interface configured to contact a surface of a digital wrist watch portable computer device, the impact protection device comprised of an impact absorbing material to protect the peripheral component from damage when the peripheral component is coupled to the portable computer device, wherein the first interface is adapted to receive a portion of peripheral component protruded outside the portable computer.

14. An impact protection device of claim 13 where the portable computer has a slot for receiving the peripheral component card.

15. An impact protection device of claim 13 where peripheral component is a secure digital input/output (SDIO) card and the first interface is configured to receive the SDIO card when the SDIO card is inserted into the portable computer.

16. An impact protection device of claim 15 where the peripheral component protrude outside the slot for receiving the peripheral component.

17. An impact protection device of claim 15 where the portable computer has a front side where a display screen is located, a back side opposite the front side, a right side, a left side, a top side and a bottom side and wherein the slot for receiving the peripheral component is on the top side of the portable computer.

18. An impact protection device of claim 15 where the slot for receiving the peripheral component is on the right side of the portable computer.

19. An impact protection device of claim 15 where the slot for receiving the peripheral component is on the left side of the portable computer.

20. An impact protection device of claim 15 where the slot for receiving the peripheral component is on the bottom side of the portable computer.

21. An impact protection device of claim 15 wherein the protective device protects the protruding portion of the peripheral card when the peripheral card is inserted into the portable computer.

22. An impact protection device of claim 14 wherein the impact protection device is made out of a material allowing transfer of energy through the material.

23. A system comprising:
   a digital wrist watch portable computer having a first slot provided for receiving a first portion of a peripheral component;
   an impact protection device having a second slot provided for receiving a second portion of the peripheral component, wherein a surface of the impact protection device contacts a surface of the portable computer when the first portion of the peripheral component is received by the first slot and the second portion of the peripheral component is received in the second slot;
   a peripheral component having a first portion and a second portion; wherein the first portion is inserted inside the first slot provided for receiving the peripheral component, wherein a portion of the peripheral component protrudes outside the slot provided for receiving the peripheral component.

24. An impact protection device of claim 23 where the slot for receiving the peripheral component is on the right side of the portable computer.

25. An impact protection device of claim 23 where the slot for receiving the peripheral component is on the left side of the portable computer.

26. An impact protection device of claim 23 where the slot for receiving the peripheral component is on the bottom side of the portable computer.

* * * * *